United States Patent [19]
Morie

[11] Patent Number: 5,111,430
[45] Date of Patent: May 5, 1992

[54] NON-VOLATILE MEMORY WITH HOT CARRIERS TRANSMITTED TO FLOATING GATE THROUGH CONTROL GATE

[75] Inventor: Takashi Morie, Kanagawa, Japan

[73] Assignee: Nippon Telegraph and Telephone Corporation, Tokyo, Japan

[21] Appl. No.: 541,911

[22] Filed: Jun. 21, 1990

[30] Foreign Application Priority Data

Jun. 22, 1989 [JP] Japan .................................. 1-158381
Apr. 16, 1990 [JP] Japan .................................. 2-97578

[51] Int. Cl.$^5$ ............................................. G11C 11/34
[52] U.S. Cl. ..................................... 365/185; 365/49; 357/6; 357/23.5
[58] Field of Search ............... 365/185, 45; 357/23.5, 357/6

[56] References Cited

U.S. PATENT DOCUMENTS

| | | | |
|---|---|---|---|
| 3,778,645 | 12/1973 | Matiauch et al. | 357/6 |
| 4,035,820 | 7/1977 | Matzen | 357/23.5 |
| 4,037,242 | 7/1977 | Gosney | 357/23.5 |
| 4,513,397 | 4/1985 | Ipri et al. | 365/185 |
| 4,626,887 | 12/1986 | Schmitt-Landsieder et al. | 357/6 |
| 4,630,081 | 12/1986 | Calviello | 357/6 |
| 4,686,558 | 8/1987 | Adam | 357/23.5 |
| 4,752,912 | 6/1988 | Guterman | 365/185 |
| 4,907,197 | 3/1990 | Uchida | 365/185 |
| 4,907,198 | 3/1990 | Arima | 365/185 |
| 4,910,565 | 3/1990 | Masuoka | 357/23.5 |
| 4,924,437 | 5/1990 | Paterson et al. | 365/185 |
| 4,967,393 | 10/1990 | Yokoyama et al. | 365/185 |

OTHER PUBLICATIONS

S. M. Sze et al., "Hot-Electron Transport in Semiconductor-Metal-Semiconductor Structures", Journal of Applied Physics, vol. 37, No. 7, Jun. 1966, pp. 2690-2695.

Takaaki Hagiwara et al., "A 16 kbit Electrically Erasable PROM Using n-Channel Si-Gate MNOS Technology", IEEE Journal of Solid-State Circuits, vol. SC-15, No. 3, Jun. 1980, pp. 346-353.

Masanori Kikuchi et al., "A DSA-type Non-Volatile Memory Transistor with Self-Aligned Gates", Japanese Journal of Applied Physics, vol. 17 (1978) Supplement 17-1, pp. 49-54.

H. Kume et al., "A Flash-Erase EEPROM Cell with an Asymmetric Source and Drain Structure", IEDM 87, pp. 560-563.

Mark Holler et al., "An Electrically Trainable Artificial Neural Network (ETANN) with 10240 Floating Gate Synapses", IJCNN (International Joint Conference on Neural Network), 1989, vol. 2 of Articles, pp. 191-196.

Primary Examiner—Joseph E. Clawson, Jr.
Attorney, Agent, or Firm—Blakely, Sokoloff, Taylor & Zafman

[57] ABSTRACT

A non-volatile memory includes a charge injecting electrode, a control electrode, and a floating electrode. The charge injecting electrode generates hot carriers by a tunnel effect. The control electrode is formed on the charge injecting electrode to set a tunnel voltage. The floating electrode is formed on the control electrode via an insulating film. The hot carriers generated by the charge injecting electrode are injected over an energy barrier of the insulating film into the floating electrode.

15 Claims, 11 Drawing Sheets

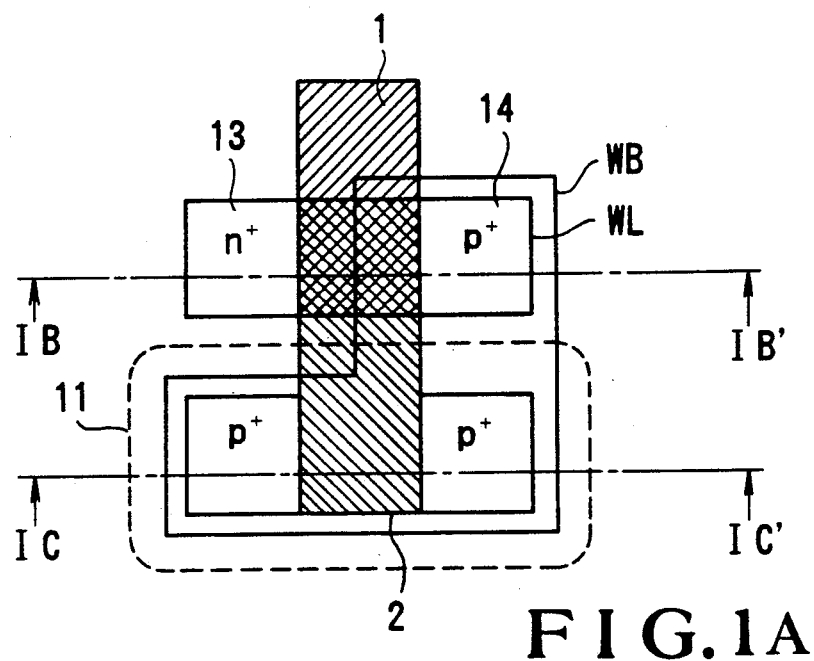
F I G. 1A
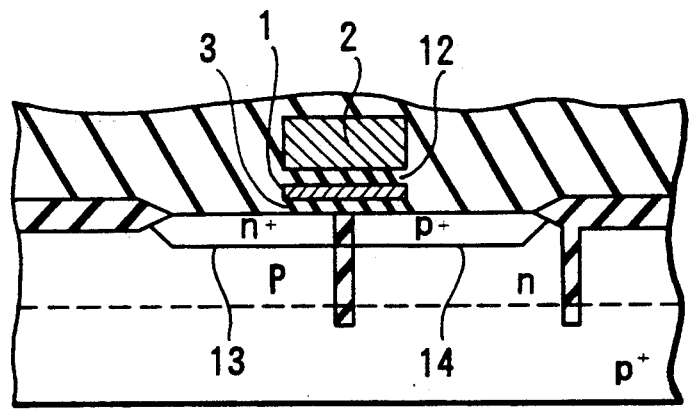
F I G. 1B
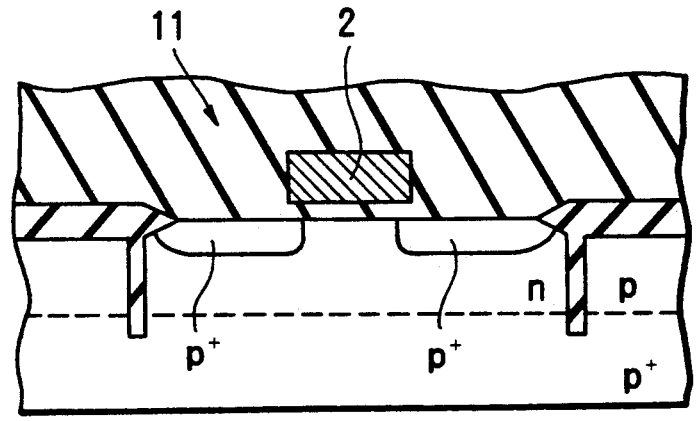
F I G. 1C

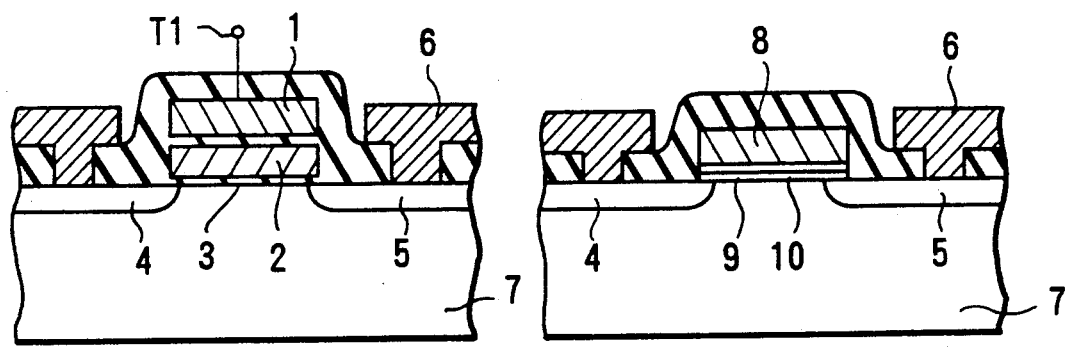
FIG.10 PRIOR ART
FIG.11 PRIOR ART
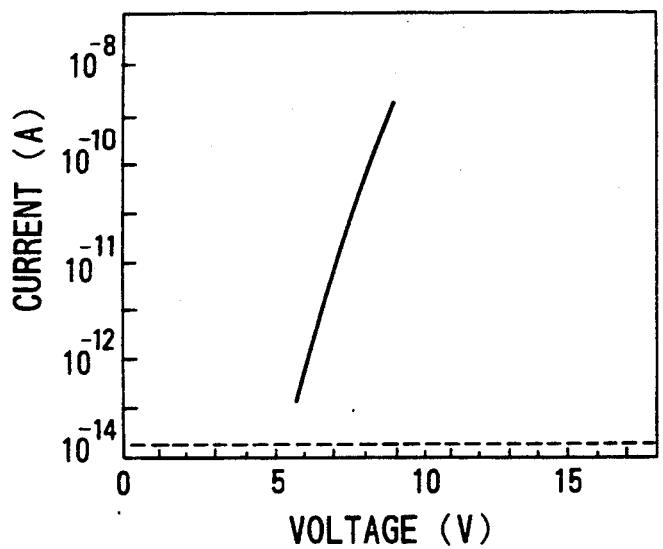
FIG.12
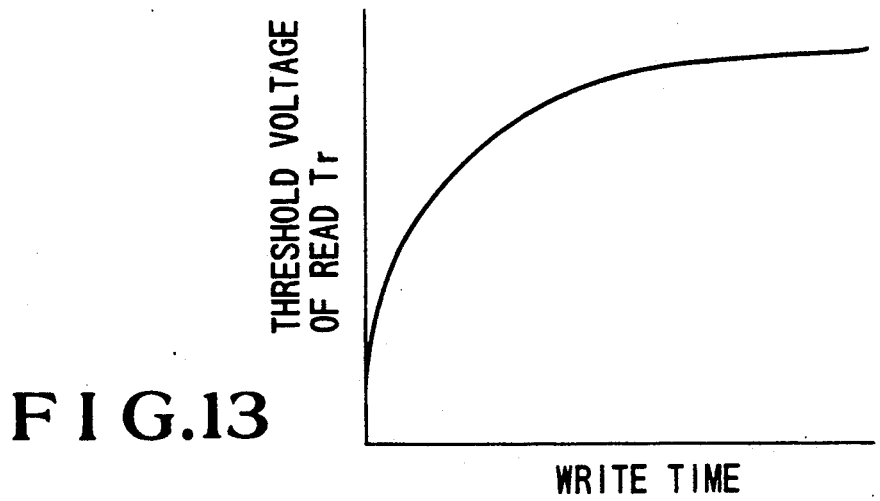
FIG.13

NON-VOLATILE MEMORY WITH HOT CARRIERS TRANSMITTED TO FLOATING GATE THROUGH CONTROL GATE

BACKGROUND OF THE INVENTION

The present invention relates to an electrically erasable non-volatile memory.

In recent years, it has been attempted to manufacture a recognition apparatus having a practical function such as pattern recognition after the model of a neural network of a living body. If such an apparatus is realized by an SiLSI which is currently highly integrated, a great merit is obtained. In this case, an element having the same function as that of a synapse which is a coupling portion between neurons must be developed. This function stores an analog coupling strength and can increase/decrease the stored coupling strength by learning. Although an electrically erasable programmable read only memory (to be abbreviated to an "EEPROM" hereinafter) is considered a predominant candidate for such an element, this EEPROM has the following drawbacks.

EEPROMs which are currently mainly used are classified into a floating electrode type as shown in FIG. 10 and an MNOS (Metal-Nitride-Oxide-Semiconductor) type as shown in FIG. 11. In FIGS. 10 and 11, reference numeral 1 denotes a control electrode; 2, a floating electrode; 3, a tunnel insulating film; 4, a source region; 5, a drain region; 6, an aluminum wire; 7, an Si substrate; 8, a gate; 9, an oxide film; 10, a nitride film; and T1, a power source terminal. An information write operation is realized by injecting an electric charge into the floating electrode or a trap in the interface between the oxide and nitride films by a tunnel current through the insulating film or channel hot electron injection.

In an element having either of the above structures, a charge injection rate largely depends on a potential difference between charge injection and storage sides. Therefore, when the potential of a charge storage portion changes as an electric charge is stored, it becomes difficult to continuously, linearly store the electric charge. This phenomenon will be described below by taking a case in which an electric charge is injected into a floating electrode by a tunnel effect as an example.

FIG. 12 shows a typical current-voltage characteristic obtained in a silicon oxide film (thickness=100Å, area=250×250 $\mu$m) by a tunnel effect. When a current is small, a tunnel current is exponentially increased with respect to an applied voltage. In a general EEPROM, as shown in FIG. 10, a voltage is applied to the control electrode 1 formed above the floating electrode 2 and acts on the tunnel insulating film 3 by capacitive coupling. By this electric field, electrons are injected from the substrate 7 into the floating electrode 2 by the tunnel effect. When the electrons are stored in the floating electrode 2, the voltage applied on the tunnel insulating film 3 is reduced. As a result, the tunnel current is exponentially reduced in accordance with the characteristic shown in FIG. 12. For this reason, when a write operation is performed at a constant voltage, the potential of the floating electrode substantially logarithmically changes with respect to a time as shown in FIG. 13. In FIG. 13, the ordinate indicates a change amount of a threshold value of a MOS transistor having the floating electrode 2 as its gate, i.e., an amount proportional to a charge amount stored in the floating electrode 2.

For the above reason, it is difficult to write analog information in a conventional EEPROM, i.e., only digital information representing 1 or 0 (written or nonwritten) can be stored therein.

In order to store analog information in a conventional EEPROM, a write voltage value capable of injecting a charge amount corresponding to an analog amount to be written must be calculated and applied by an external computer, i.e., complicated control must be externally performed for an LSI. This is reported in, e.g., M. Holler, S. Tam, H. Castro, and R. Benson, "An Electrically Trainable Artificial Neural Network (ETANN) with 10240 'Floating Gate' Synapses," IJCNN (International Joint Conference on Neural Network), 1989, Vol. 2 of Articles, p. 191.

SUMMARY OF THE INVENTION

It is, therefore, an object of the present invention to provide a non-volatile memory which can easily store analog information.

It is another object of the present invention to provide a non-volatile memory in which the relationship between a write/erase time and a stored charge amount are substantially linear at a constant write/erase voltage.

It is still another object of the present invention to provide a non-volatile memory having a higher density and higher performance than those of a conventional non-volatile memory.

In order to achieve the above objects of the present invention, there is provided a non-volatile memory comprising a charge injecting electrode for generating hot carriers by a tunnel effect, a control electrode, formed on the charge injecting electrode, for setting a tunnel voltage, and a floating electrode formed on the control electrode via an insulating film, wherein the hot carriers generated by the charge injecting electrode are injected over an energy barrier of the insulating film into the floating electrode.

BRIEF DESCRIPTION OF THE DRAWINGS

FIG. 1A is a plan view showing an arrangement of the first embodiment of a non-volatile memory according to the present invention;

FIG. 1B is a schematic sectional view taken along a line IB—IB' in FIG. 1A;

FIG. 1C is a schematic sectional view taken along a line IC—IC' in FIG. 1A;

FIGS. 10 and 11 are schematic sectional views showing typical conventional non-volatile memories;

FIG. 12 is a graph showing a typical tunnel characteristic in a silicon oxide film; and FIG. 13 is a graph showing a relationship between a write time and a threshold value change amount of a transistor having a floating electrode as its gate in an EEPROM.

DESCRIPTION OF THE PREFERRED EMBODIMENTS

A non-volatile memory to be disclosed in this invention is a floating electrode type non-volatile memory characterized in that a very thin control electrode for setting a tunnel voltage is formed between a charge injecting electrode and a floating electrode. An operation principle of this memory will be described below.

Carriers (electrons or holes) injected from the charge injecting electrode toward the control electrode by a tunnel effect caused by a potential difference between the charge injecting electrode and the control electrode are injected in a hot (high-energy) state into the control electrode. Since the control electrode is very thin, these carriers pass through the control electrode while maintaining their hot state. The carriers jump over an energy barrier of an insulating film formed between the control electrode and the floating electrode and reach the floating electrode.

On the basis of the above principle, either a positive or negative electric charge can be stored in the floating electrode. A potential difference for a tunnel is determined by the potential difference between the charge injecting electrode and the control electrode and is not influenced by the potential of the floating electrode. Therefore, a charge injecting rate does not depend on the stored charge amount. Therefore, since a stored charge amount are substantially proportional to a write time, analog information can be easily stored.

In a conventional structure, since a control electrode is formed above a floating electrode, a voltage applied on a tunnel insulating film is a capacitive partial voltage of a voltage between a charge injecting electrode and the control electrode. Since this voltage depends on a stored charge amount, a charge storage rate is exponentially reduced as the stored charge amount is increased.

An embodiment arranged in accordance with the principle of the present invention by using SiLSI manufacturing techniques will be described below. This embodiment can be similarly arranged by using a compound semiconductor such as GaAs.

Figure 2A:
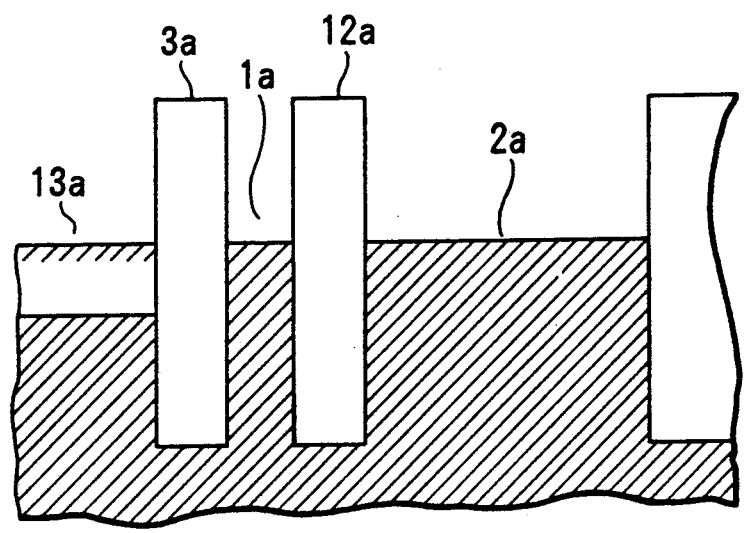
FIGS. 2A to 2C are energy band diagrams for explaining the first embodiment.
Figure 2B:
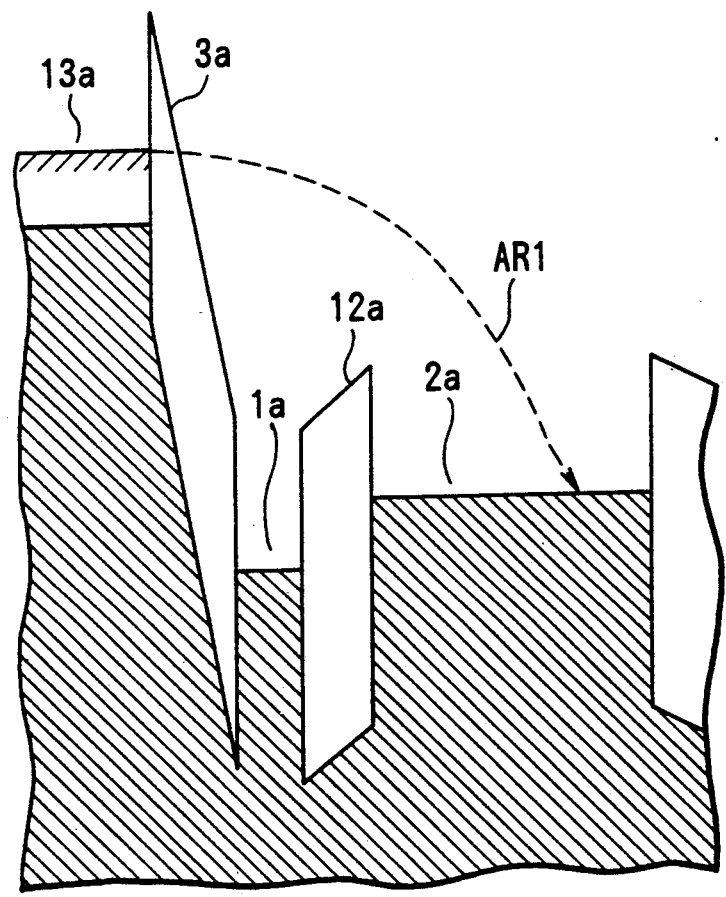
Figure 2C:
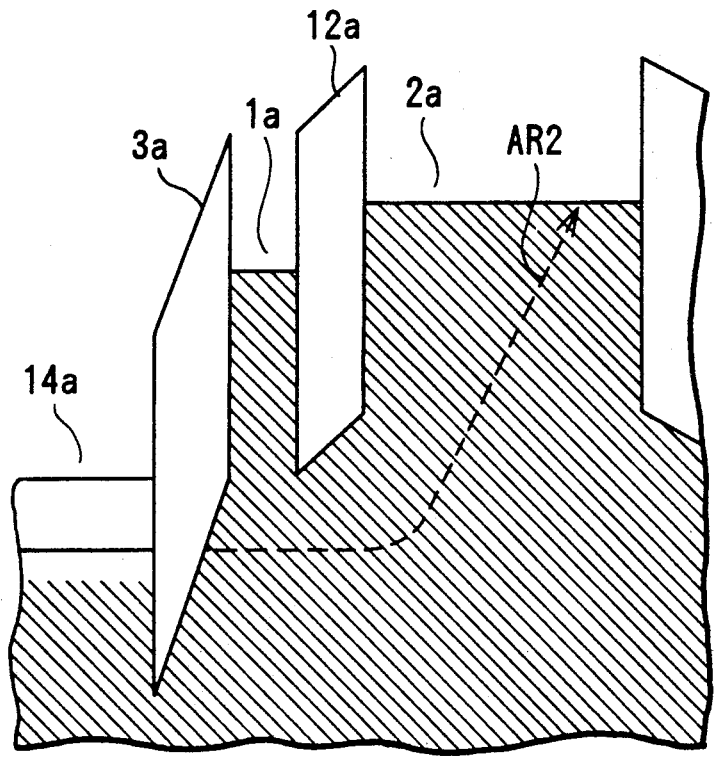

FIGS. 1A to 1C show a structure of the first embodiment of a non-volatile memory according to the present invention, and FIGS. 2A to 2C are energy band diagrams obtained in a write mode and the like. The structure and the operation principle of the first embodiment will be described below with reference to FIGS. 1A to 1C and 2A to 2C.

In this embodiment, since an enhancement PMOS transistor is used as a read transistor 11, this memory can be used as an analog memory only while a gate voltage is negative. Therefore, a state in which a positive electric charge is stored in a floating electrode 2 as a total will not be considered. Note that the read transistor 11 may be a depletion type or an NMOS. That is, any transistor can be used as the read transistor 11 as long as it can detect a potential change in the floating electrode 2. The type of electric charge to be stored in the floating electrode 2 differs in accordance with the arrangement of the read transistor 11.

Unlike a digital memory, expressions "write mode" and "erase mode" are unsatisfactory in an analog memory. In this embodiment, by injecting electrons into the floating electrode 2, the potential of the floating electrode can be reduced, and the channel resistance of the read transistor 11 can be reduced. To the contrary, by injecting holes, the potential of the floating electrode 2 can be increased, and the channel resistance can be increased. In this case, the former mode will be called a "negative write mode", and the latter, a "positive write mode".

In addition, in this embodiment, a diffusion layer formed on an Si substrate is used as the charge injecting electrode, and diffusion layers of both p and n conductivity types are used in consideration of the symmetry of the tunnel effect in positive and negative write modes. Theoretically, however, the charge injecting electrode may be a diffusion layer of one conductivity type or a metal similar to the control electrode formed on a substrate.

The structure of this embodiment will be described below with reference to FIGS. 1A to 1C. Any material can be used as the material of a control electrode 1 and the floating electrode 2 as long as it has a conductivity. Examples of the material are doped polysilicon, aluminum, gold, molybdenum, and tungsten. The thickness of the control electrode 1 is decreased to be as small as possible, e.g., about 100Å in order to minimize scattering/absorption of high-energy carriers. The thickness of the floating electrode 2 is set to be 1,000Å or more so as not to allow injected carriers to pass through.

Silicon oxide films are used as a tunnel insulating film 3 and an insulating film 12 between the control and floating electrodes 1 and 2. A work function difference between the control electrode materials enumerated above and the silicon oxide film is about 3 to 4 eV. Therefore, if a maximum potential change in the floating electrode 2 caused by an electric charge stored in the floating electrode 2 is 3 V, an energy of carriers required immediately after tunneling occurs is at least 7 eV from the floating electrode 2 side. With this energy difference, an oxide film thickness which allows a sufficient tunnel current to flow without causing dielectric breakdown is about 80Å. In this case, the tunnel current is of a Fowler-Nordheim type, and the carriers reach a conduction band of the oxide film by the tunnel effect and are accelerated therein.

The thickness of the insulating film 12 is determined as follows. In a write mode, high-energy carriers pass through the conduction band of the insulating film 12 and are scattered by phonons to lose their energy. In order to minimize this energy loss, the thickness of the insulating film is preferably decreased to be as small as possible. However, the insulating film 12 must have a thickness which does not allow the electric charge stored in the floating electrode 2 to pass through and reach the control electrode 1 side by the tunnel effect in a stand-by state or a read state. When the maximum value of a potential change in the floating electrode 2 is 3 V as described above, the thickness of the insulating film 12 is about 70Å.

Charge injecting electrodes 13 and 14 are diffused layers having an impurity concentration of about $10^{20}$ cm$^{-3}$ or more.

In FIG. 1A, reference symbol WB denotes a well separating trench; and WL, an n well. FIG. 1B is a sectional view taken along a line 1B—1B' in FIG. 1A, and FIG. 1C is a sectional view taken along a line 1C—1C' in FIG. 1A.

An operation of the first embodiment of the present invention will be described below with reference to FIGS. 2A, 2B, and 2C. FIG. 2A is an energy band diagram obtained when no charge is stored in the floating electrode 2 and no write bias is applied. In this case, a contact potential difference between the electrode materials is neglected since it is not important. In the following description, assume that the charge injecting electrodes 13 and 14 are normally set at the 0 potential. In FIGS. 2A to 2C, reference symbol 2a corresponds to the floating electrode (metal) 2; 12a, the insulating film 12; 1a, the control electrode (metal) 1; 3a, the tunnel insulating film 3; and 13a, the charge injecting electrode (n+ Si) 13. In addition, the longitudinal direction indicates an energy level, and a hatched portion indicates an energy range within which electrons are present.

FIG. 2B shows a negative write state. In the negative write mode, a positive bias (7 V or more) is applied to the control electrode 1 to inject electrons from the charge injecting electrode 13 as indicated by an arrow AR1. Even if the potential of the floating electrode 2 is lowered as the electrons are stored, the electrons can be injected without depending on the potential of the floating electrode 2 as long as an energy distribution of the electrons incident on the insulating film 12 is much higher than an energy barrier of the insulating film 12.

FIG. 2C shows a positive write state. In the positive write mode, a negative vias (e.g., −4 V or more) is applied to the control electrode 1 to inject holes from the charge injecting electrode (p+ Si) 14 as indicated by an arrow AR2. As described above, since the potential of the floating electrode 2 is normally lower than that of the control electrode 1 in this structure, an energy to be given to the holes need only be a work function difference (about 4 eV) or more between the control electrode 1 and the insulating film 12.

Figure 2D:
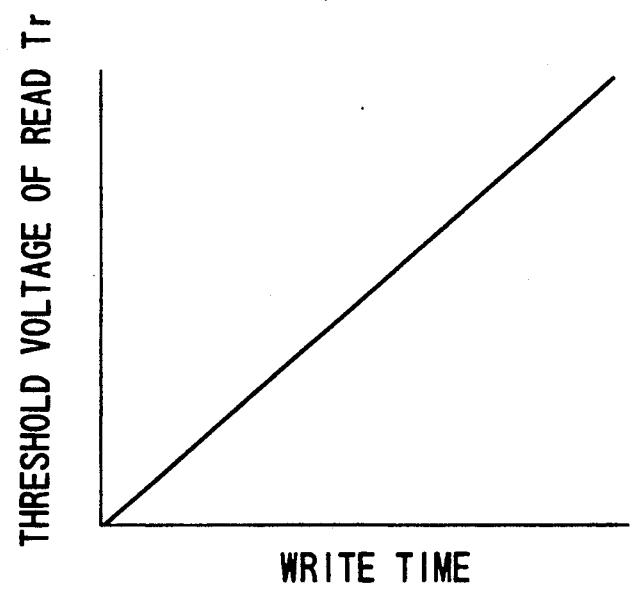
FIG. 2D is a graph showing a relationship between a write time and a threshold value change amount of a transistor having a floating electrode as its gate obtained when the present invention is applied to an EEPROM.

FIG. 2D is a graph showing a relationship between a write time and a threshold voltage of a transistor having the floating electrode as its gate obtained when the present invention is applied to an EEPROM. In the arrangement of the present invention, as shown in FIG. 2D, since the tunneling potential difference is determined by the potential difference between the charge injecting electrode and the control electrode, an electric charge can be stored in the floating electrode in proportion to an injection time.

In addition, unlike in conventional techniques, a method of capacitive coupling is not adopted as a method of applying a voltage to the tunnel insulating film. Therefore, since the capacitance of each portion is not limited, a cell area can be reduced as compared with conventional devices.

Furthermore, since the capacitance of the floating electrode can be reduced, a sufficient voltage change can be obtained by a small charge amount.

In the above first embodiment, the potential of the floating electrode 2 is kept lower than that of the control electrode 1 by an electric charge stored in the floating electrode 2, and carriers flow over the energy barrier of the insulating film 12. Therefore, the carriers must have an energy including a quantity corresponding to a potential lowering in the floating electrode 2. For this reason, when the tunnel insulating film is formed by a silicon oxide film, its film thickness is limited, and a tunnel current becomes a Fowler-Nordheim type. In this case, the carriers propagate through the conduction band of the insulating film for a long time period, resulting in a large energy loss. In addition, carriers having a higher energy are scattered and absorbed more strongly, and an amount of electrons reaching the floating electrode 2 is reduced as a whole. Therefore, in the second embodiment of the present invention to be presented below, a structure which eliminates these drawbacks and can store an arbitrary charge amount in the floating electrode 2 without causing carriers to have an excessive energy will be disclosed with reference to FIGS. 3A, 3B, and 3C.

Figure 3A:
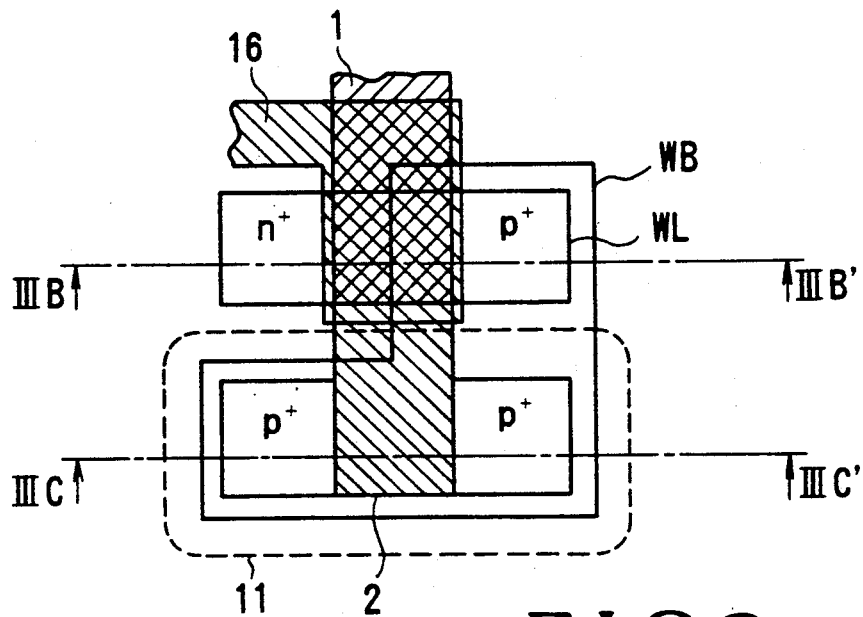
FIG. 3A is a schematic plan view showing the second embodiment of a non-volatile memory according to the present invention.
Figure 3B:
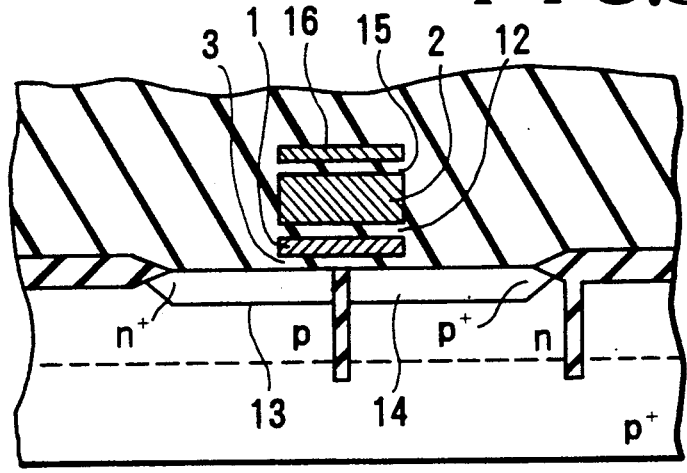
FIG. 3B is a schematic sectional view taken along a line 3B—3B' in FIG. 3A.

In the second embodiment of the present invention, the same reference numerals as in the first embodiment denote the same parts, and a second control electrode (to be referred to as an "auxiliary control electrode" hereinafter) 16 is formed on a floating electrode 2 via an insulating film 15 in addition to the structure of the first embodiment (FIG. 3B). Therefore, the structure of the second embodiment is complicated as compared with that of the first embodiment, but the following advantages are obtained.

The material of the auxiliary control electrode 16 is the same as that of a control electrode 1 or the floating electrode 2. Since the auxiliary control electrode 16 is required to perform only potential setting, its film thickness is particularly not limited, e.g., it is 1,000Å. Similar to insulating films 3 and 12, the material of the insulating film 15 is silicon oxide. The film thickness of the insulating film 15 is substantially the same as that of the insulating film 12, i.e., 70Å.

Figure 4A:
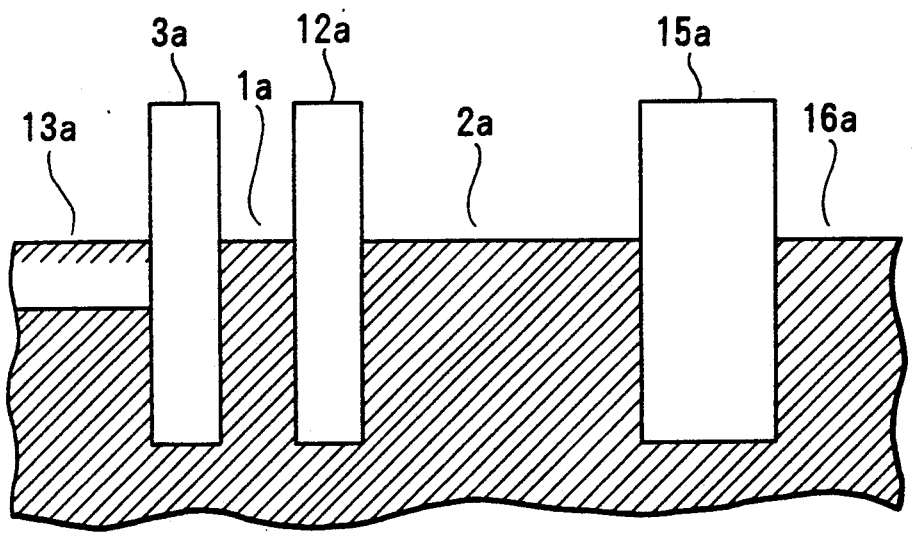
FIGS. 4A to 4C are energy band diagrams for explaining the second embodiment.
Figure 4B:
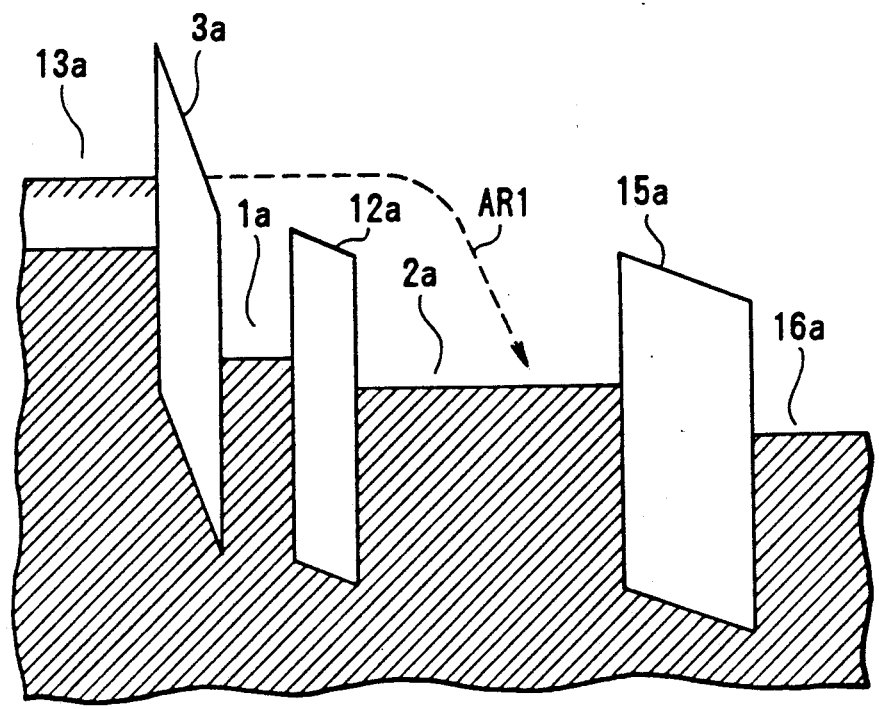

In a negative write mode, a positive bias deeper than a bias applied to the control electrode 1 is applied to the auxiliary control electrode 16 so that the potential of the floating electrode 2 is kept higher than that of the control electrode 1 even while electrons are stored in the floating electrode 2 (FIG. 4B). As a result, an increase in energy barrier of the insulating film 12 caused when the potential of the floating electrode 2 is lowered by storage of electrons can be prevented. Therefore, an energy of electrons need only be a work function difference (about 4 eV) or more between the floating electrode 2 and the control electrode 1. This does not depend on the charge amount stored in the floating electrode 2. Note that in FIGS. 4A to 4C, reference symbol 15a corresponds to the insulating film 15; and 16a, the auxiliary control electrode (metal) 16, and the same reference numerals as in FIGS. 2A to 2C denote the same or corresponding parts.

Since an energy required by electrons can be lower than that in the first embodiment, another advantage is obtained. That is, since a voltage to be applied to the floating electrode 2 need only be about 4 V or more, the thickness of the tunnel insulating film 3 can be made small. Therefore, an oxide film can be advantageously used in a region close to a direct tunnel as a tunnel mechanism not passing through the conduction band of the oxide film. Since electrons flow for only a short distance in the conduction band, an energy loss is reduced. In the case where doped polysilicon is used as a gate material, conditions of obtaining a direct tunnel are an oxide film thickness of 40Å or less and an applied electric field of 10 MV/cm or less. However, since a current density is as small as about $10^{-6}$ A/cm$^2$ under these conditions, a tunnel area must be increased to perform a write operation at a high speed. In the second embodiment, the film thickness of the tunnel oxide film 3 is set to be 50Å. In addition, since an energy of electrons obtained when hot carriers pass through the control electrode is smaller than that in the first embodiment, a ratio of scattered/absorbed electrons is small. Therefore, a ratio of electrons reaching the floating electrode 2 is advantageously increased as compared with that in the first embodiment.

Figure 4C:
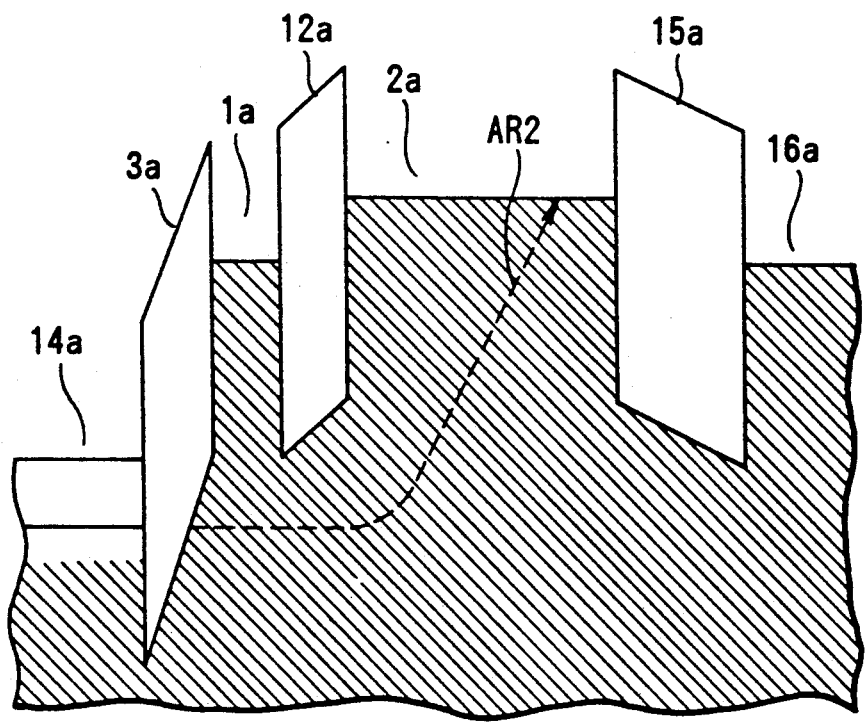

In a positive write mode, a negative bias (e.g., $-4$ V or more) is applied to the control electrode to inject holes from the charge injecting electrode (p+ electrode) 14. At this time, a negative bias deeper than the bias applied to the control electrode 1 is applied to the auxiliary control electrode 16 so that the potential of the floating electrode 2 is kept lower than that of the control electrode 1 even while holes are stored in the floating electrode 2. However, since a negative write operation is normally performed to lower the potential of the floating electrode 2, the same bias as the control potential need only be applied to the auxiliary control electrode 16 (FIG. 4C).

In addition, since the film thickness of the insulating film 12 is not particularly limited but can be increased to be 100Å or more, a charge holding characteristic can be improved. This is one of great advantages of this embodiment while a holding characteristic cannot be improved in a conventional floating electrode type EEPROM since the thickness of a tunnel insulating film is decreased to realize a low write voltage.

Figure 3C:
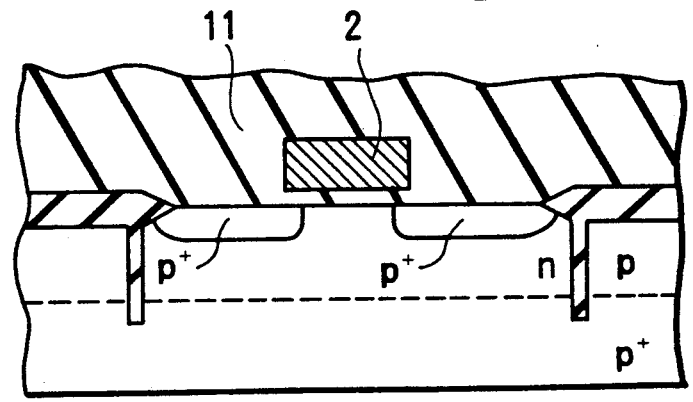
FIG. 3C is a schematic sectional view taken along a line 3C—3C' in FIG. 3A.
Figure 3D:
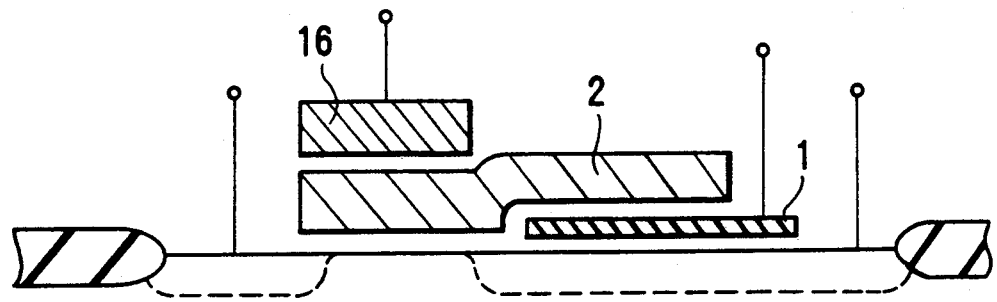
FIG. 3D is a schematic view showing a modification of the second embodiment.

Note that since the auxiliary control electrode 16 need only be capacitive-coupled to the floating electrode 2, it need not be formed on the entire upper surface of the floating electrode as shown in FIGS. 3A to 3C. For example, as shown in a schematic view of FIG. 3D, the auxiliary control electrode 16 is formed on a portion of the floating electrode 2 at a position shifted from that of the control electrode 1 located below the floating electrode 2. In addition, the auxiliary control electrode 16 can be omitted by using capacitive coupling of the read transistor 11. Similar to FIG. 2A, FIG. 4A shows an energy band gap indicating an initial state with no bias nor electric charge.

Figure 5A:
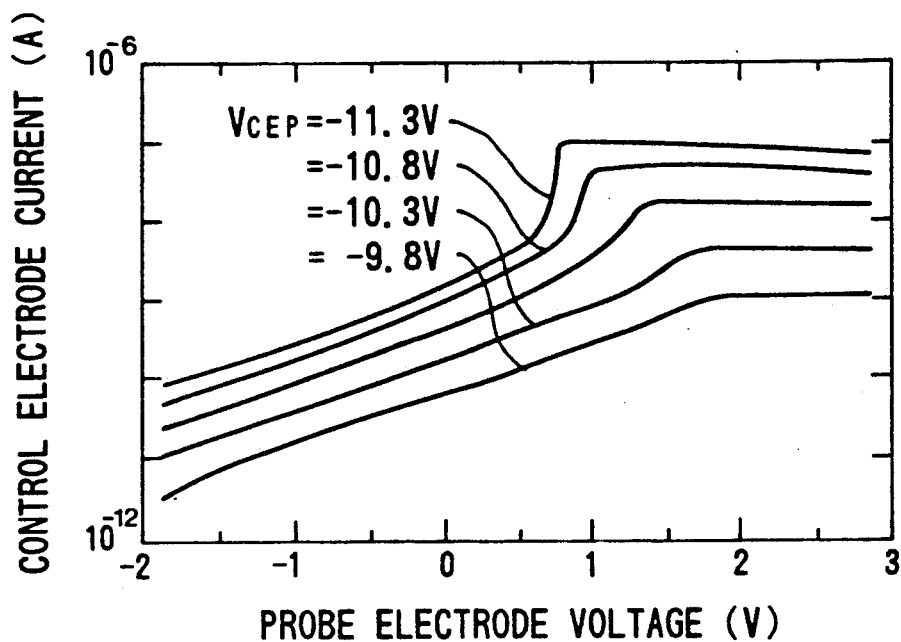
FIGS. 5A and 5B are graphs each showing experimental data demonstrating effectiveness of the second embodiment.
Figure 5B:
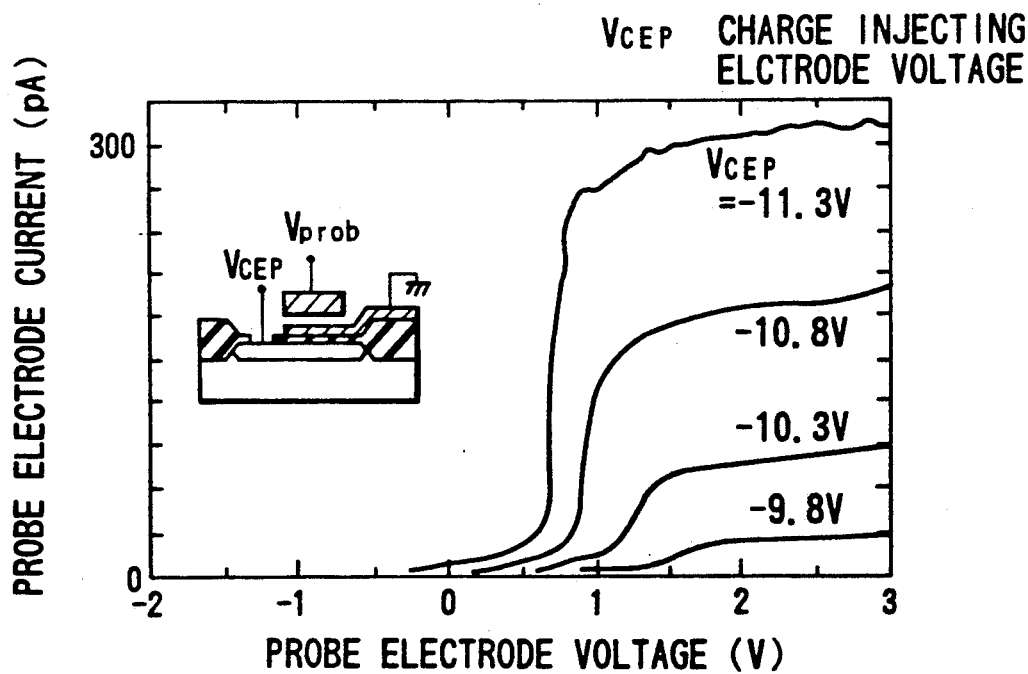
Figure 6A:
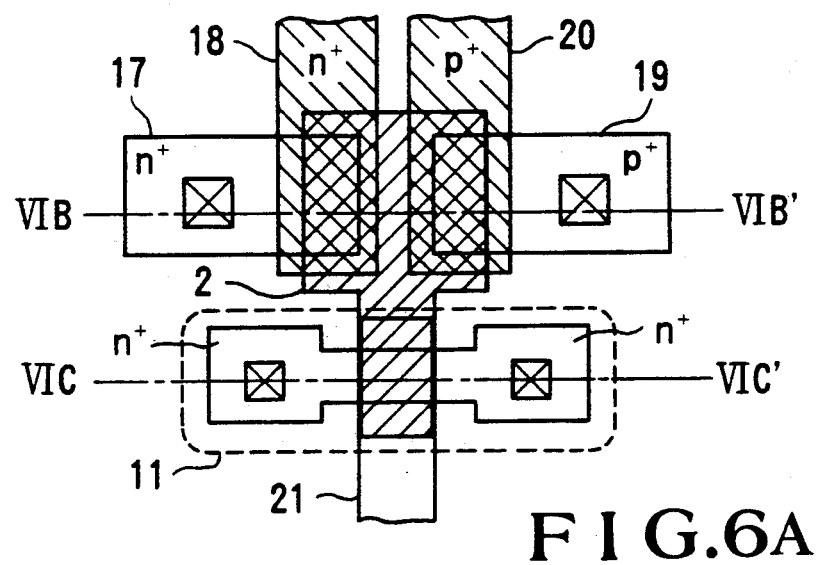
FIG. 6A is a schematic plan view showing the third embodiment of a non-volatile memory according to the present invention.
Figure 6B:
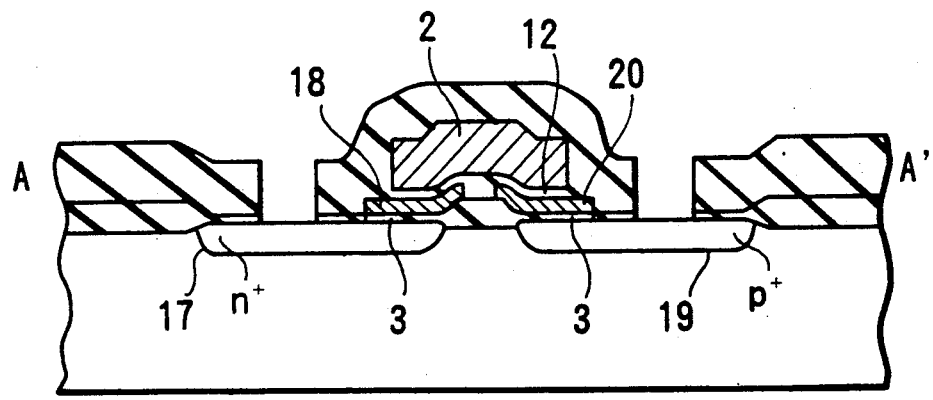
FIG. 6B is a schematic sectional view taken along a line 6A—6A' in FIG. 6A.
Figure 6C:
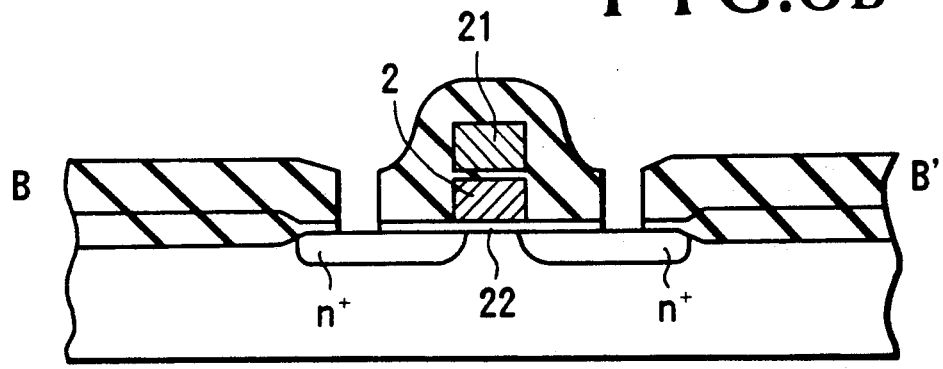
FIG. 6C is a schematic sectional view taken along a line 6B—6B' in FIG. 6B.

Results of an experiment performed to demonstrate the effectiveness of the second embodiment will be described below. In this experiment, a terminal was attached to the floating electrode to check a current flowing into the floating electrode while the voltage of the floating electrode was changed. Since this electrode is no longer a "floating" electrode, it is called a probe electrode in the following description. The film thickness of the tunnel insulating film was 75Å, and a tunnel region area was 1.1 μm$^2$. A phosphorus-doped polysilicon layer having a thickness of 130Å and an impurity concentration of about $5 \times 10^{19}$ cm$^{-3}$ was used as the control electrode. The same phosphorus-doped polysilicon layer having a thickness of 1,500Å was used as the probe electrode. A 150-Å thick Si oxide film was used as an insulating film (corresponding to the insulating film 12) between the control and probe electrodes. FIGS. 5A and 5B show a relationship between the potential of the probe electrode and a current flowing through the control and probe electrodes. In FIGS. 5A and 5B, the voltage of the control electrode is set at 0 V. In FIG. 5B, when a voltage of, for example, $-11.3$ V is applied to the charge injecting electrode, a probe electrode current starts flowing when the voltage of the probe electrode exceeds 0.7 V and is increased by only 15% or less when the probe electrode voltage is increased from 1 V to 3 V. As compared with the fact that a current is exponentially increased in a conventional EEPROM structure, this result indicates that the probe electrode current has almost no dependency on the probe electrode voltage. That is, the effectiveness of the second embodiment is demonstrated.

It should be noted that almost no probe electrode current flows when the probe electrode voltage is 0.7 V or less. The reason for this phenomenon is assumed as follows. That is, since the impurity concentration of polysilicon used as the control electrode is not sufficiently high, the thin control electrode is entirely depleted by a high applied voltage, and the voltage of the control electrode is not kept at 0 V. When the probe electrode voltage is increased to exceed 0.7 V, depletion of the control electrode is released by the voltage of the probe electrode, and the voltage of the control electrode is fixed. As a result, the probe electrode current abruptly flows. This assumption correctly explains the characteristics (FIG. 5A) of the control electrode current. That is, if the voltage of the control electrode is perfectly fixed, the control electrode current must be maintained constant regardless of the probe electrode voltage. Therefore, the principle that a current flows while the voltage of the probe electrode is lower than that of the control electrode as described in the first embodiment is not denied by FIG. 5B.

The third embodiment which is a more practical arrangement of the second embodiment obtained by using a polysilicon gate process as a conventional EEPROM manufacturing technique will be described below with reference to FIGS. 6A, 6B, 6C, 7A, and 7B.

In this embodiment, two pairs of charge injecting electrodes and control electrode having different conductivity types (n electrodes 17 and 18 and p electrodes 19 and 20) are prepared in correspondence with positive and negative write operations. A diffused layer formed in a silicon substrate is used as a charge injecting electrode, and doped polysilicon is used as a control electrode. In addition, a tunnel insulating film 3 and an insulating film (silicon oxide film) 12 formed between a floating electrode 2 and the control electrodes 18 and 20 are used.

A read transistor 11 for detecting a charge amount stored in the floating electrode 2 includes a gate 21. This gate solves the problem of the type of read transistor described in the beginning of the first embodiment. That is, similar to a conventional arrangement, the charge amount stored in the floating electrode is detected as a threshold value change in the read transistor. Therefore, the gate 21 corresponds to a control electrode of a conventional EEPROM. In the present invention, the gate 21 also functions as an auxiliary control electrode described in the second embodiment. The thickness of a gate insulating film 22 must be much larger than that of the tunnel insulating film 3 so as not to allow an electric charge to be injected from this portion to the floating electrode in a write mode. For example, the thickness of the gate insulating film 22 is 120Å or more.

Figure 7A:
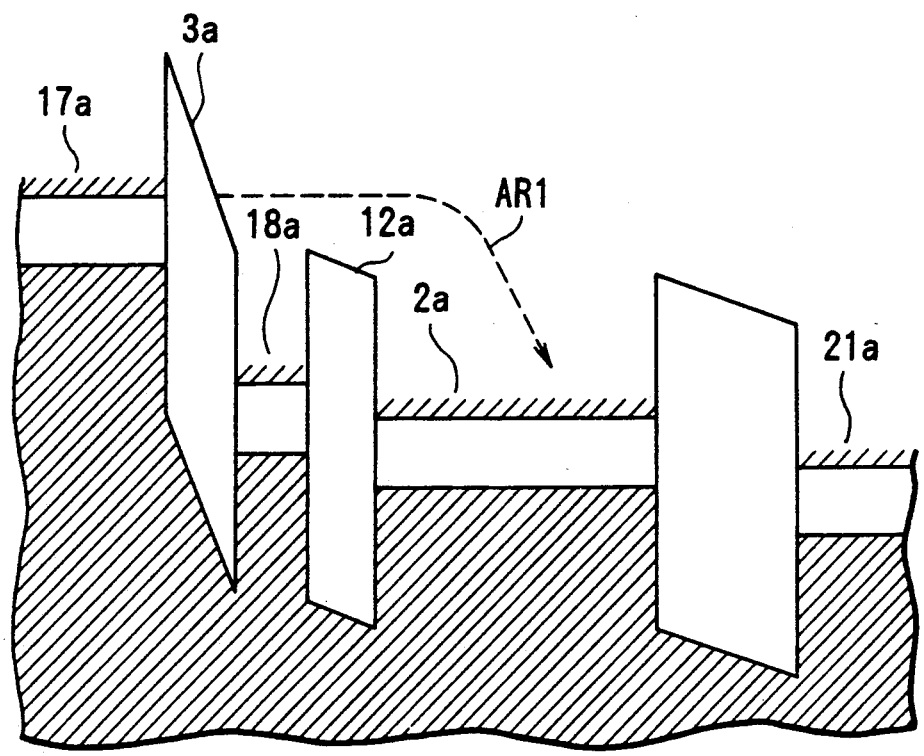
FIGS. 7A and 7B are energy band diagrams for explaining an operation of the third embodiment.

FIG. 7A is an energy band diagram obtained in a negative write mode. Since the gate 21 is capacitive-coupled to the floating electrode 2, a positive bias deeper than a bias applied to the control electrode 18 is applied to the gate 21 in the negative write mode so that the voltage of the floating electrode 2 is kept higher than that of the control electrode 18 even when electrons are stored in the floating electrode 2.

Figure 7B:
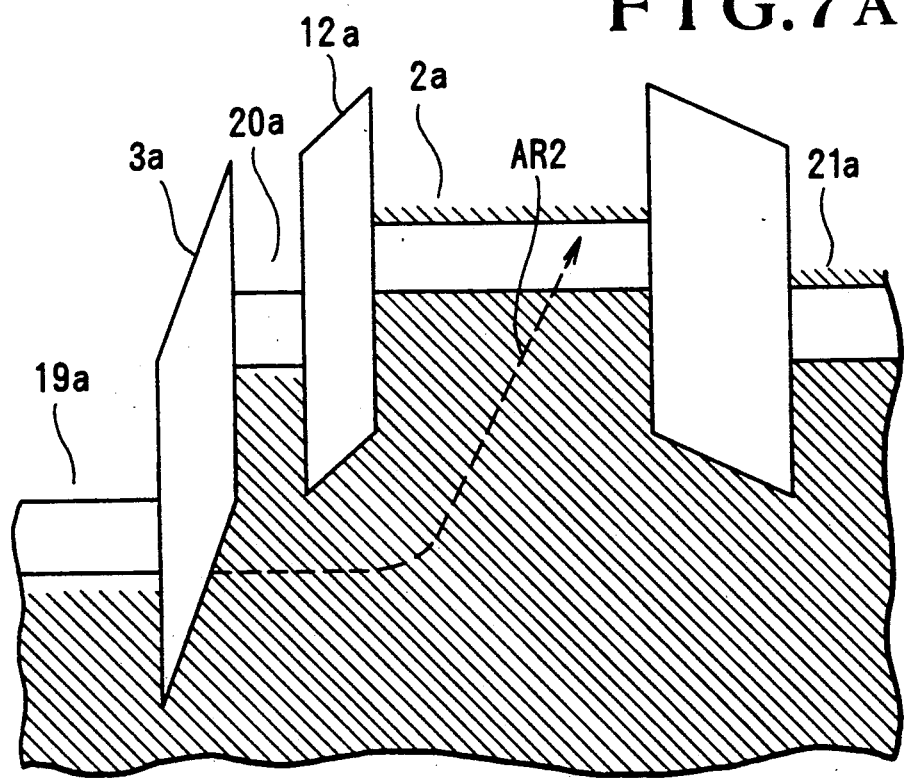

FIG. 7B is an energy band diagram obtained in a positive write mode. Similarly, a suitable bias is applied to the gate 21 to keep the voltage of the floating electrode 2 lower than that of the control electrode 20 even when holes are stored in the floating electrode 2.

The reason why electrode pairs having different conductivity types are required in correspondence with the positive and negative write modes will be described below. Firstly, an n semiconductor is suitable for the charge injecting electrode in a negative write mode and a p semiconductor is suitable therefor in a positive write mode in relation to current supply. Secondly, when a negative bias is applied to a control electrode 18 (n+ polysilicon) as the control electrode to inject holes to the control electrode side, electrons simultaneously flow from the control electrode 18 toward the charge injecting electrode. Since no higher electric field can be applied to the tunnel insulating film 3 due to this current, it becomes difficult to inject hot holes. This is the same in an opposite case.

Figure 8:
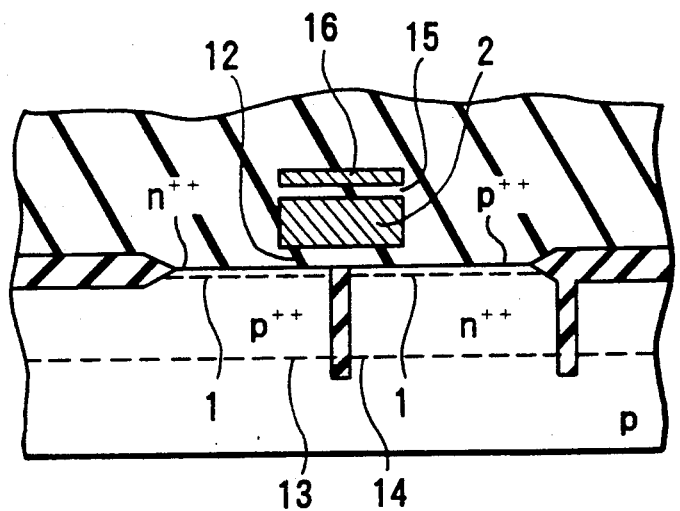
FIG. 8 is a sectional view showing the fourth embodiment of a non-volatile memory according to the present invention.
Figure 9A:
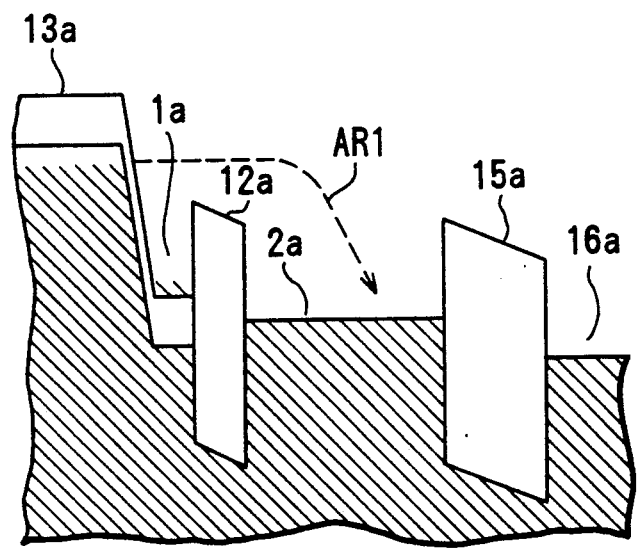
FIGS. 9A and 9B are energy band diagrams for explaining an operation of the fourth embodiment.
Figure 9B:
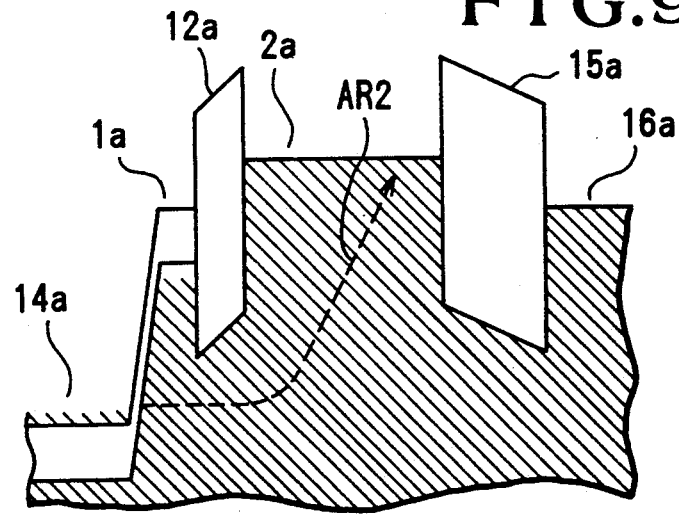

In each of the first to third embodiments, tunneling between the charge injecting electrode and the control electrode is performed through the insulating film 3. In the fourth embodiment shown in FIGS. 8, 9A, and 9B, however, charge injecting electrodes 13 (p++) and 14 (n++) and a control electrode 1 (n++ and p++) are formed of high-concentration diffused layers of opposite conductivity types, and carriers are injected by interband tunneling obtained by a sharp band bending at a p-n junction under a reverse bias.

As has been described above, the present invention includes a charge injecting electrode for generating hot carriers by a tunnel effect, a control electrode, formed between the charge injecting electrode and the floating electrode, for setting a tunnel voltage, and an insulating film formed between the control and floating electrodes. Since hot carriers are injected into the floating electrode over an energy barrier of the insulating film which covers the floating electrode, a voltage difference for a tunnel is determined by a voltage difference between the charge injecting and control electrodes without being influenced by the voltage of the floating electrode. Therefore, if the control electrode is very thin, a tunnel current is not reduced by an electric charge stored in the floating electrode. Therefore, an electric charge can be stored in the floating electrode in proportion to an injection time, and the threshold value of a transistor having the floating electrode as its gate can be changed in proportion to the injection time. As a result, a non-volatile memory which can easily store an analog value is obtained.

When an auxiliary control electrode is formed on the floating electrode via the insulating film, as in the second embodiment, the floating electrode can be covered with an insulating film having a larger thickness than that of a conventional floating electrode type EEPROM cell. Therefore, an EEPROM having a good electric charge holding characteristic can be obtained.

In a conventional EEPROM, capacitive division of a capacitance between a charge injecting electrode and a floating electrode and a capacitance between the floating electrode and a control electrode is used to apply a voltage to a tunnel insulating film formed between the charge injecting electrode and the floating electrode. Therefore, in order to effectively apply a write voltage to be applied to the control electrode to the tunnel insulating film, a ratio of the capacitance between the charge injecting and floating electrodes with respect to that between the floating and control electrodes must be minimized. However, a decrease in the former capacitance is limited, and a decreasing in thickness of the insulating film between the floating and control electrodes in order to increase the latter capacitance is not preferable since the charge holding characteristic is degraded. Therefore, since an overlap area between the floating and control electrodes must be maximized, it becomes difficult to reduce a cell area. Since the present invention does not adopt a method of capacitive coupling, a capacitance of each portion is not limited. Therefore, a cell area can be easily reduced. In addition, since the capacitance of the floating electrode can be reduced, a sufficient threshold voltage change of the read transistor can be effectively obtained with a small charge amount.

According to the present invention having the above advantages, therefore, a high-density, high-performance memory capable of easily storing analog information in a non-volatile manner can be obtained. That is, without using any complicated external control circuit, a write voltage pulse having a predetermined voltage value can be used to store information proportional to the number of pulses in a memory in a non-volatile manner while a high holding characteristic is maintained. If the memory is applied to an LSI formed after the model of a neural network, a high-density, high-performance neural network type analog LSI can be arranged to manufacture, e.g., a pattern or voice recognition apparatus having very high performance.

What is claimed is:

1. A non-volatile semiconductor memory device comprising:
    means for injecting a first type of charges, said means for injecting a first type of charges comprising:
        a first charge injecting electrode;
        a first insulating film formed on said charge injecting electrode for passing a tunnel current;
        a first control electrode formed on said first insulating film,
        wherein said first charge injecting electrode, said first insulating film and said first control electrode are formed overlapping at least in a first overlap region;
    a second insulating film formed on said first control electrode; and
    a floating electrode formed on said second insulating film;
    means for sensing an amount of total charges stored in said floating electrode,
    wherein said second insulating film and said electrode are formed overlapping at least on said first overlap region, and
    wherein said first charge injecting electrode is connected to a high potential and said first charge injecting electrode emits said first type of charges, and said first type of charges is stored in said floating electrode, said first type of charges is injected into and stored in said floating electrode through said first insulating film, said first control electrode and said second insulating film.

2. A non-volatile semiconductor memory according to claim 1, wherein said first control electrode is a thin conductive film having a thickness of less than approximately 100 angstroms.

3. A non-volatile semiconductor memory device according to claim 1, wherein said first type of charges are electrons, and said first charge injecting electrode comprises an n type semiconductor.

4. A non-volatile semiconductor memory device according to claim 1, wherein said first type of charges are holes, and said charge injecting electrode comprises a p type semiconductor.

5. A non-volatile semiconductor memory device according to claim 1 further comprising:
   a third insulating film formed on said floating electrode;
   an auxiliary control electrode formed on said third insulating film such that said auxiliary control is capacitively coupled to said floating electrode.

6. A non-volatile semiconductor memory device according to claim 1 further comprising:
   means for injecting a second type of charges, said means for injecting a second type of charges comprising:
      a second charge injecting electrode;
      a fourth insulating film formed on said second charge injecting electrode for passing tunnel current;
      a second control electrode formed on said fourth insulating film;
   wherein said second charge injecting electrode, said fourth insulating film, and said second control electrode are formed overlapping at least in a second overlap region, and
   wherein said means for injecting a second type of charges is set such that said second control electrode is in contact with said second insulating film, and said means for injecting a second type of charges is also set on the same side of said second insulating film as said means for injecting a first type of charges, and said means for injecting a second type of charges is also set such that said second insulating film and said floating gate are formed overlapping at least in said second overlap region; and
   wherein said second charge injecting electrode is connected to a high potential and said second charge injecting electrode emits said second type of charges, said second type of charges is stored in said floating electrode, said second type of charges is injected into and stored in said floating electrode through said fourth insulating film, said second control electrode and said second insulating film.

7. A non-volatile semiconductor memory device according to claim 6 wherein:
   said third insulating film is formed on said floating electrode;
   said auxiliary control electrode is formed on said third insulating film such that said auxiliary control electrode is capacatively coupled to said floating electrode.

8. A non-volatile semiconductor memory device according to claim 1, wherein said first type of charges are electrons and said means for injecting said first type of charges further comprises:
   a first charge injecting electrode having a p++ type semiconductor;
   a first control electrode having an n++ type semiconductor;
   wherein said first charge injecting electrode and said first control electrode are formed overlapping at least in a first overlap region, and
   wherein a reverse voltage is applied between said p++ type semiconductor and said n++ type semiconductor such that an energy gap at a p-n junction is used as an energy barrier for passing a tunneling current.

9. A non-volatile semiconductor memory device according to claim 1, wherein said first type of charges are electrons and said means for injecting said first type of charges further comprises:
   a first charge injecting electrode having an n++ type semiconductor;
   a first control electrode having a p++ type semiconductor;
   wherein said first charge injecting electrode and said first control electrode are formed overlapping at least in a first overlap region, and
   wherein a reverse voltage is applied between said n++ type semiconductor and said p++ type semiconductor such that an energy gap at a p-n junction is used as an energy barrier for passing a tunnel current.

10. A non-volatile semiconductor memory device according to claim 8, wherein said first control electrode has a thickness of less than approximately 100 angstroms.

11. A non-volatile semiconductor memory device according to claim 9, wherein said first control electrode has a thickness of less than approximately 100 angstroms.

12. A non-volatile semiconductor memory device according to claim 8 wherein:
   said third insulating film is formed on said floating electrode;
   said auxiliary control electrode is formed on said third insulating film such that said auxiliary control electrode is capacitively coupled to said floating electrode.

13. A non-volatile semiconductor memory device according to claim 9 wherein:
   said third insulating film is formed on said floating electrode;
   said auxiliary control electrode is formed on said third insulating film such that said auxiliary control electrode is capacitively coupled to said floating electrode.

14. A non-volatile semiconductor memory device according to claim 8 further comprising:
   means for injecting holes, said means for injecting holes further including:
      a second charge injecting electrode having an n++ type semiconductor;
      a second control electrode having a p++ type semiconductor;
   wherein said second charge injecting electrode and said second control electrode are formed overlapping at least in a second overlap region, and
   wherein said means for injecting holes is set such that said second control electrode is in contact with said second insulating film, and said means for injecting holes is set on the same side of said second insulating film as said means for injecting said first type of charges, and said means for injecting holes is set such that said second insulating film and said floating gate are formed overlapping at least in said second overlap region.

15. A non-volatile semiconductor memory device according to claim 14 wherein:
   said third insulating film is formed on said floating electrode;
   said auxiliary control electrode is formed on said third insulating film such that said auxiliary control electrode is capacitively coupled to said floating device.

* * * * *

UNITED STATES PATENT AND TRADEMARK OFFICE
CERTIFICATE OF CORRECTION

PATENT NO. : 5,111,430
DATED : May 5, 1992
INVENTOR(S) : Morie

It is certified that error appears in the above-identified patent and that said Letters Patent is hereby corrected as shown below:

In claim 1 in column 10 at line 64 change "on said" to --in said--;

In claim 7 in column 11 at line 65 change "capacatively" to --capacitively--;

In claim 9 in column 12 at line 17 change "electrons" to --holes--; at line 18 delete "further".

Signed and Sealed this

Fifth Day of September, 1995

Attest:

BRUCE LEHMAN

*Attesting Officer*   *Commissioner of Patents and Trademarks*